United States Patent [19]

Banavar et al.

[11] 4,167,791

[45] Sep. 11, 1979

[54] NON-VOLATILE INFORMATION STORAGE ARRAYS OF CRYOGENIC PIN DIODES

[76] Inventors: Jayanth R. Banavar, 5604 5th Ave., #106, Pittsburgh, Pa. 15232; Darryl D. Coon, 6354 Morrowfield Ave., Pittsburgh, Pa. 15217; Gustav E. Derkits, Jr., 4531 Forbes Ave., Apt. 608, Pittsburgh, Pa. 15213

[21] Appl. No.: 872,303

[22] Filed: Jan. 25, 1978

[51] Int. Cl.² ............................................. G11C 11/40
[52] U.S. Cl. ...................................... 365/175; 307/238; 307/277; 357/1; 357/30; 357/63; 357/64; 365/189
[58] Field of Search ...................... 357/1, 5, 83, 30, 63, 357/64; 307/277, 306, 238; 365/160, 175, 186, 189

[56] References Cited

U.S. PATENT DOCUMENTS

| 3,118,130 | 1/1964 | Rediker et al. | 357/1 |
| 3,121,808 | 2/1964 | Kahng et al. | 357/83 |
| 3,810,128 | 5/1974 | Moser | 357/64 |
| 3,821,784 | 6/1974 | Heald et al. | 357/64 |
| 3,833,894 | 9/1974 | Aviram et al. | 357/8 |

Primary Examiner—William D. Larkins
Attorney, Agent, or Firm—B. R. Nath

[57] ABSTRACT

A semiconductor memory device exhibiting non-volatile storage characteristics is disclosed. The device comprises a storage element, maintained in a prescribed range of temperatures, which exhibits an effect of charge storage and release of the stored charge upon application of a suitable bias voltage. Information is stored by exposure to light or by applying a suitable bias voltage to put the device into one of a multiplicity of long-lived states. In the case of exposure to light the state of the device is indicative of the integrated photon flux. Information can be stored or read out in times as short as 1 nanosecond or less and will remain stored for as long as $10^5$ seconds or longer without any sustaining voltage. A plurality of the memory devices can be interconnected in an array and can be used as a memory storage bank.

31 Claims, 5 Drawing Figures

NON-VOLATILE INFORMATION STORAGE ARRAYS OF CRYOGENIC PIN DIODES

BACKGROUND OF THE INVENTION

This invention relates generally to memory devices and more particularly to a high-speed non-volatile semiconductor memory device which can be switched from one state to a second significantly different state in response to an applied signal, e.g., a voltage pulse or an applied light pulse or an incident electron beam or the generation of free carriers within certain regions of the device; the device will maintain said second state for long periods of time without any sustaining voltage being applied. The memory device of the invention is capable of electrical readout, and can be used in information storage apparatus employing such elements or arrays thereof, using means for maintaining the memory devices at a temperature within a predetermined range of temperatures.

FIELD OF THE INVENTION

A novel information storage device is disclosed herein, using a new effect of charge storage and discharge in semiconductor junction devices having rectifying regions, when these devices are maintained at low temperatures, e.g., cryogenic temperatures. When a reverse bias voltage is applied across the rectifying region and increased rapidly at sufficiently fast sweep speeds, stored charge is released in a pulse of current when the voltage reaches a critical value. This critical value is dependent on the specific composition and construction of the junction device. When displayed on an oscilloscope screen, the current pulse appears as a peak in the dq/dV vs. V curve. In some cases, several peaks are observed at different voltages, although one of the peaks is normally much larger and more pronounced than the others.

Most of the results outlined hereinafter refer to junction devices exemplarily made of silicon in which the rectifying region consists of a region of highly doped p-type material and a region of highly doped n-type material and, in between said highly doped regions, a region of very lightly doped material.

A range of sweep speeds is envisaged in the context of this invention, and, upon varying the sweep speed from $10^2$ to $10^{11}$ volts/sec. it was found that the charge (integrated current) released during the current pulse seemed to vary rather insignificantly. Through the size and structure of the pulse, the device exhibits a memory of exposure to light or forward injection. The size of the pulse is a function of the integrated incident light signal and, with increased exposure, with certain embodiments, the pulse develops substructure. The reverse bias voltage at which the current pulse appears is well below the avalanche breakdown voltage of the device.

On starting from zero bias and sweeping the voltage in the negative (reverse bias) direction, the current pulse occurs when the voltage reaches $-V_p$. In the examples used during experimentation, the range of $V_p$ was 0 to 100 volts. $V_p$ was found to have a slight degree of dependence on sweep speeds, but for the purposes of this invention, the dependence was not very significant. Examples of techniques and circuitry for applying sweeping voltages can be found in the textbook, *Basic Electronics for Scientists* by James J. Brophy, published by McGraw Hill in 1972.

The properties of the aforementioned current pulse were studied in detail and are summarized below:

1. Shining light on the device at the initial bias, before applying a voltage-sweep, results in a larger pulse, although the pulse never exceeds a certain "saturation" size. Furthermore, in certain cases the pulse develops substructure which is dependent on how much light has been incident on the device. There is no significant wavelength dependence of the structure and size of the pulse over the range 3500 A to 7500 A. The position of the pulse $(-V_p)$ is substantially independent of the wavelength and intensity of the incident light. The device behaves as an opto-integrator in that it will collect light as and when light is incident on it and, on sweeping the voltage, will behave the same way as if all the light has been incident on it at once. That is, it responds to the total amount of light incident on it, without regard to the variation of flux with time during the time between sweeps. The device will produce essentially the same pulse, regardless of whether it is swept immediately after exposure to light or is stored suitably in the dark for up to several days before sweeping. Thus the lifetime of the state of the device after exposure to light is significantly much longer than several days.

2. Upon sweeping, after pulsing the device into the forward bias injection region, it is found that injection produces nearly the same pulse as does exposure to light. The states produced by injection are also stable, having lifetimes much longer than several days.

There is a continuum of long-lived stable states of the device between the dark state and the fully saturated state, each of which corresponds to having prepared the device by appropriately exposing it to a definite amount of light or injected charge. Under appropriate conditions the size of the pulse is a monotonically increasing function of the total amount of light incident on the device or the charge injected into the device before sweeping the voltage.

3. Sweeping the voltage without prior injection or exposure to light results in a "dark current pulse" which is a small fraction of the size of the saturated light pulse. The observed ratios of the sizes of the saturated light pulse and the dark current pulse range from 4 to about 80. The dark current pulse is rounded and does not have any substructure.

4. Furthermore, certain of the junction devices referred to supra have a fairly accurate memory of the starting voltage or the exposure voltage. The phenomenon is characterized by the dark or light pulse being displaced by approximately the same amount from the starting or exposure voltage, respectively. For example, starting at zero bias leads to a pulse at $-V_p$, while starting at $-10$ volts produces a pulse at $-(V_p+10)$ volts. However, the pulse becomes smaller in size at more negative starting bias and loses its substructure in those devices which exhibit a pulse with substructure.

5. The position and width of the pulse are not overly influenced by the sweep speed. The height of the peak grows in proportion to the sweep speed, and the amount of charge associated with the pulse is fairly independent of the sweep speed.

6. On varying the temperature between 4° K. and 14° K., there is a small but systematic change in the size, structure and position of the pulse.

Between 14° K. and 24° K., ($-V_p$) changes smoothly towards the starting bias voltage. At about 24° K., the pulse vanishes altogether.

7. In certain of these devices the pulse has a rise time less than 0.3 nanosecond. The mechanism involved in the effect is not yet completely understood.

DESCRIPTION OF PRIOR ART

Various types of electrical devices for information storage and retrieval are known, and a brief outline of some types which may be analogous in the context of this invention is given below.

U.S. Pat. No. 3,950,738 to Hayashi et. al. discloses a semiconductor non-volatile optical memory device which is constructed by providing light-permeable charge retention means in an insulating layer on a first semiconductor surface into which photo-generated carriers in the surface of the first semiconductor region are injected over the semiconductor-insulator potential barrier by applying a reverse bias between the first semiconductor region and a second region forming a rectifying junction with the first semiconductor region. Also disclosed is a non-volatile memory integrated circuit employing one or more said devices together with a light source in the same package. The non-volatile memory integrated circuit operates under low bias voltage and is compatible with a high-speed integrated logic circuit.

U.S. Pat. No. 3,407,394 to Hartke discloses a method and apparatus for the electrical storage and retrieval of information which utilizes the trapping of electrical charges within the bulk of the homogeneous photoconductive insulating material due to differential hole-electron mobility to form a space charge within that bulk. The neutralization of this charge trapped within the bulk of the photoconductive insulating material may be utilized to produce an electrical signal indicative of the information stored. A layered structure is utilized comprising in sequence a conductive layer, a blocking layer, a light absorbing homogeneous photoconductive insulating layer which is adapted to trap at least one polarity of charge carrier; another electrical blocking layer, and an electrically conducting layer are utilized as a structure to carry out the desired functions. In general, at least one of the electrically conductive layers will be transparent to allow optical switching of the photoconductive layer.

U.S. Pat. No. 3,987,474 to Walker teaches a non-volatile charge storage element wherein long-term charge storage occurs in the interface states of the element. Charge is stored at low applied voltages ($\leqq 10$ volts) in short times ($\leqq 1$ microsecond) and can be stored as long as $10^5$ seconds or longer. The states are emptied by exposure to radiation in the visible or the near infrared regions of the spectrum. There are described, also, an information storage device employing a plurality of such elements and a solid-state camera wherein the image screen includes a plurality of such elements. Changes in the charge storage in each of the elements results in changes in the capacitance of the element; either the capacitance of the element or its charge state is sensed to indicate the state of the element for information storage purposes. In one embodiment, thin film techniques are employed and a change in transconductance is detected to sense the charge state.

In U.S. Pat. No. 3,821,784 to Heald et. al. a switching transistor with memory is provided in which a selected junction (preferably the base-emitter junction) is fabricated to have a high injection efficiency and multiple acceptor or donor trapping centers in and around the depletion region of the junction. The trapping centers are chosen to be of a type for field-induced trapping dominant carriers transported across the selected junction when forward biased. To switch the transistor from one I-V characteristic to a lower I-V characteristic, the selected junction is biased in a forward direction to a predetermined threshold level for field-induced trapping of said carriers by the distributed trapping centers, thereby creating a stable and stationary space charge domain in the current path of the selected junction. The transistor is reset by reverse biasing the selected junction to a level where the space charge domain is annihilated.

U.S. Pat. No. 3,118,130 to Rediker et. al. teaches a bistable semiconductor device whose operation at liquid helium temperatures utilizes the low temperature avalanche breakdown produced by impact ionization of impurities.

However, all contributions to the prior art are distinctly different from our invention in that the object of our invention is the application of a new effect in semiconductor devices at predetermined temperature conditions, discovered by the applicants, in the development of semiconductor junction devices and arrays thereof exhibiting non-volatile storage characteristics.

The object of this invention is a new application of an unusual effect, in the development of a high-speed non-volatile semiconductor device and the application of a plurality of such devices to form an array for use as a memory bank in a computer or similar apparatus.

SUMMARY OF THE INVENTION

The invention in its broad form resides in an information storage device, comprising: a plurality of individual storage elements, each said storage element having a rectifying region, and a plurality of long-lived states within a predetermined range of temperatures, each said element being switchable from a first long-lived state to a second long-lived state on applying a voltage-sweep across said rectifying region in the reverse bias direction, said voltage-sweep consisting of a voltage which changes from an initial voltage within a known range to at least a predetermined critical reverse bias voltage $V_p$ which is less than the reverse breakdown voltage of said rectifying region and around which reverse bias voltage $V_p$ a current pulse is produced by the storage element during switching, the current pulse being indicative of the state which the switched storage element was in before switching; means for maintaining said plurality of storage elements at a temperature within said predetermined range of temperatures; means for producing said voltage-sweep and applying said voltage-sweep across said rectifying region of any selected of said storage elements; means for detecting said current pulse associated with switching any selected storage element for ascertaining the state which said storage element was in before switching, thereby to read out any information stored in said selected storage element; and means for writing information into selected of said storage elements by switching said selected storage elements into any selected of said long-lived states.

The invention also discloses a method of forming and using an information storage device as above, wherein, advantageously, said rectifying region of each storage element of said plurality of elements comprises a structure which includes two exterior regions and, in between said exterior regions, an interior region comprising semiconductor material.

The novel features believed characteristic of this device are set forth with particularity in the appended claims. The invention itself, however, both as to organization and method of operation, together with further objects and advantages thereof, may best be understood by reference to the following description of an exemplary embodiment, taken in conjunction with the accompanying drawings.

DESCRIPTION OF THE PREFERRED EMBODIMENT

Figure 1:
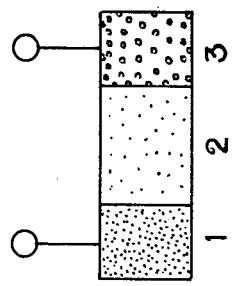
FIG. 1 illustrates an embodiment of the semiconductor junction device.
Figure 4:
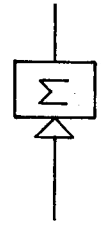
FIG. 4 illustrates a symbol for a rectifying junction exhibiting memory characteristics.

In FIG. 1 there is shown a semiconductor device having a rectifying region which, together with the means for maintaining the device at a proper operating temperature, embodies the principle of this invention. This specific illustrative embodiment consists of a body of semiconductor material comprising three regions, they being: (1) a region of highly doped p-type material, (2) a region of very lightly doped material, or undoped material, and (3) a region of highly doped n-type material. For example, the device could be made of silicon with a $10^{14}$/cc background concentration of phosphorus in a 35 $\mu$m thick i-region and the p and n regions having boron and phosphorus respectively as the dopants with the impurity density being around $10^{19}$/cc. In this particular illustrative embodiment of the device, the body of semiconductor material comprises a structure similar to what is commonly known as a pin diode.

Figure 2:
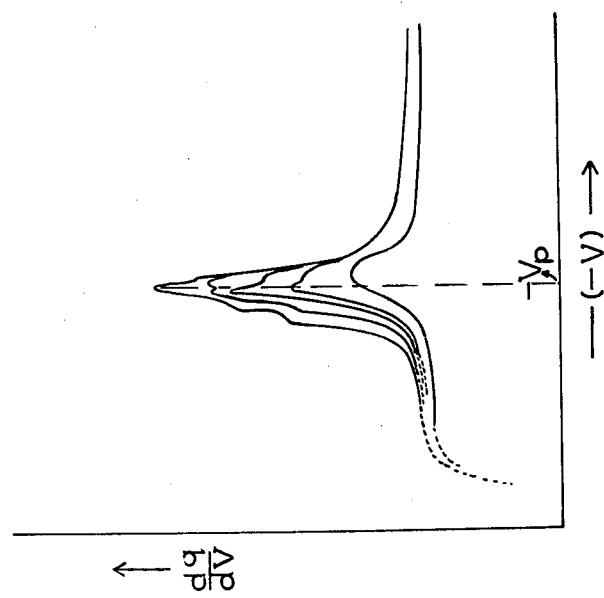
FIG. 2 illustrates dq/dV vs. V curves due to several of the multiplicity of long-lived states of a typical diode element in the array of FIG. 5, where V is the voltage across the diode and q is the charge flowing out of the diode.

This invention utilizes the observation that such structures exhibit a phenomenon of charge storage and discharge when maintained at cryogenic temperatures. When a reverse bias voltage is applied and rapidly increased through a predetermined level at a known sweep-speed, these structures release stored charge in a pulse of current. This current pulse would appear as a peak on a graph as illustrated in FIG. 2.

Means for maintaining one or more of the storage elements at a desired temperature within the predetermined range of temperatures envisaged in this invention could be any of the known means for the purpose. For instance, the storage elements may be placed in thermal contact with a reservoir of helium, or helium vapor produced from boiling liquid helium at a pressure of one atmosphere. Other methods of maintaining the storage elements at desired low-temperatures will be within the skill of anyone who has knowledge of analogous art.

The voltage-sweep referred to supra can be generated by a sawtooth generator or alternatively a pulse generator. While examples of such generators are considered to be within the skill of one who has knowledge of analogous art, typical cicuits for producing desired voltage-sweeps can be found in the textbook by Brophy referred to hereinbefore.

The rectifying region in the memory device of the invention may comprise an interior region of semiconductor material lightly doped with "n" type impurities or "p" type impurities. Alternatively, the interior region may be comprised of undoped semiconductor material.

The rectifying region has two exterior regions, one on either side of the interior region, one of which may comprise semiconductor material highly doped with "p" or "n" type impurities, the other exterior region comprising material from a group consisting of metals and alloys thereof. The semiconductor material may advantageously be chosen as silicon, and the "p" type impurity boron, and the "n" type impurity phosphorous. The interior region may comprise semiconductor material having localized, weakly bound states of charge carriers.

Various methods of writing information into the memory device are envisaged in this invention. For example, one of the methods is by applying a voltage pulse of predetermined amplitude and duration to each rectifying region in the forward bias direction. An alternative method is to expose the rectifying region to a predetermined amount of light sufficient to cause the memory device to switch into a desired long-lived state. Another method is to expose the rectifying region to an electron beam pulse of a predetermined energy content. Creating sufficient numbers of free-charge carriers within the rectifying region of a memory element switches the element into a desired long-lived state. The preferred manner of using and applying the alternative methods of writing in information is a matter of design choice and will be apparent to persons skilled in analogous art.

The plurality of information storage elements of the invention may advantageously be fabricated on a single chip of semiconductor material, resulting in commercial advantages.

Figure 5:
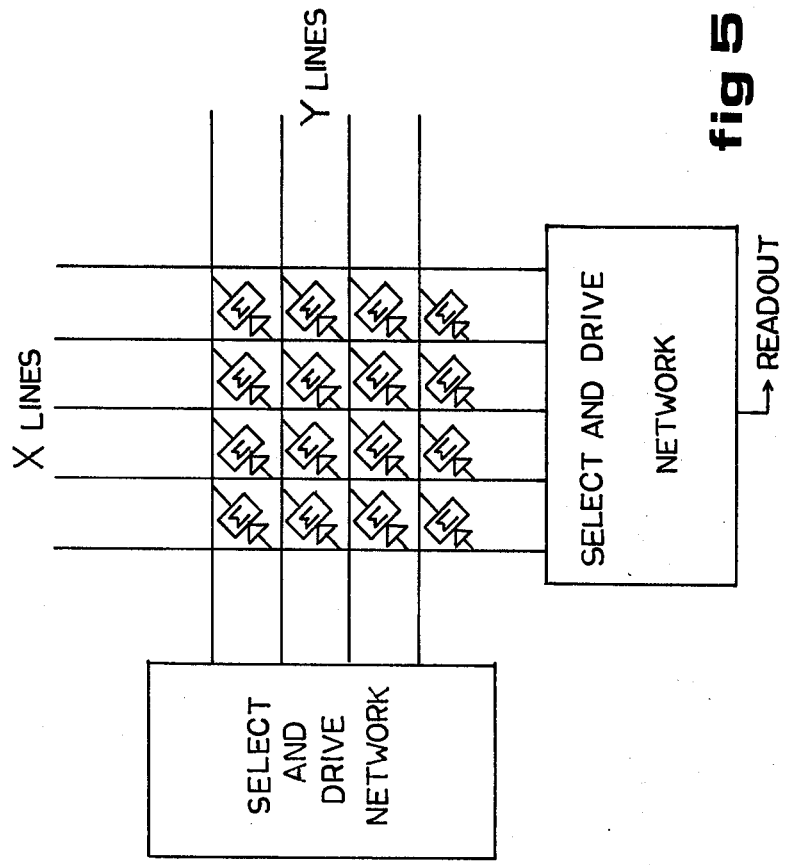
FIG. 5 illustrates a plurality of semiconductor elements exhibiting non-volatile storage characteristics in an organized array.

The characteristics of a memory array comprising a plurality of elements have been investigated. As an illustrative example, FIG. 5 shows a plurality of these memory elements connected in an array. Experiments conducted with such arrays have shown that:

1. The characteristics of the individual memory elements, as outlined above, are not impaired by connecting them in arrays.
2. It is possible to connect the elements in these arrays in such a way that operations on one element do not interfere with or alter the state of other elements of the array. We have verified this explicitly for over two billions of read-write operations.

Experiments have demonstrated that such arrays can be used as non-volatile electrical or optical input memory arrays. It is clear that such arrays can also be used as the light-sensitive area of a non-volatile imaging device.

Some novel features of our invention are:
1. The current pulse obtained on sweeping the voltage in the reverse bias direction involves a release of stored charge in a specific voltage range around a critical voltage $(-V_p)$ (FIG. 2) and is not a feature of the I-V characteristic in the normal sense of that term. It would be somewhat more accurate to describe it as a feature of the dq/dV vs. V curve.

The relation between dq/dV and V is approximately characteristic of the state of the device. This distinguishes it from inventions in the prior art which rely on different I-V characteristics to distinguish among a multiplicity of states.

2. The value of the critical reverse bias voltage ($V_p$) is significantly smaller than the avalanche breakdown voltage of the device. The phenomenon of charge release at this critical voltage ($-V_p$) is clearly not an avalanche breakdown within the normal usage of that term, as it is not self-sustaining when the junction is maintained at the critical voltage ($-V_p$).

Figure 3:
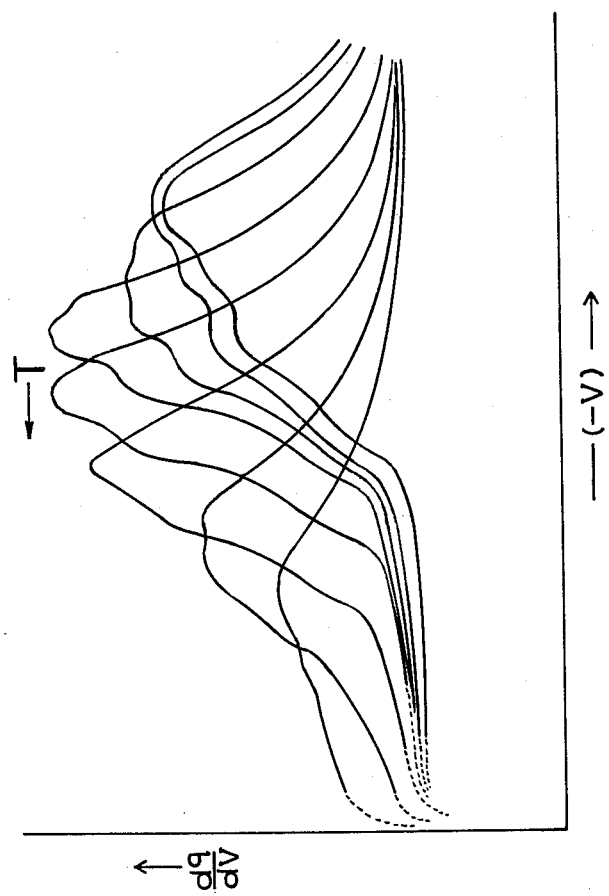
FIG. 3 illustrates the typical response of the dq/dV vs. V curve of a specific state of the multiplicity of long-lived states of a typical element in the array of FIG. 5 to a change in temperature.

3. Maintaining the device in an environment at a temperature below the critical temperature at which $V_p \rightarrow 0$ is advantageous, and some characteristics of the device, for example $V_p$, can be changed considerably by altering the operating temperature (FIG. 3). This property presents the designer of a specific embodiment with a wide range of characteristics which can be suitably exploited for the purposes of the design.

4. The stable states produced in the device by injection or exposure to light form a continuous range, within which the states corresponding to distinct levels of injection or exposure can be distinguished by the size of the pulse produced on sweeping the voltage in the reverse bias direction through $-V_p$ (FIG. 2). The device can be used for measuring or detecting light, or recording information from light.

Some other advantageous features of the invention are:

1. The pulse preserves its characteristics, as described above, even after the device is put through two billion cycles of injection, sweep, and return to the initial state. There is no degradation observed in size, shape, position, temperature response, or any of the other characteristics of the current pulse.

2. Throughout approximately one hundred warming test-cycles in which the device was taken from room temperature to its operating range of temperatures, and back again, the pulse preserved its characteristics, as described above. There was no sign of any degradation in performance. The size, shape, position and other characteristics of the pulse were preserved under such thermal cycling.

For use in memory arrays, the device would be designed and operated in such a manner as to provide switching from the basic state or another state to any other distinct state within a prescribed range of possible states. This would imply a means for driving the device into the forward injection region or for having a light pulse or an electron beam pulse of sufficient magnitude to cause switching of the device. It would also be desirable to include in the design a means of producing a voltage pulse of sufficient amplitude to take the device far enough in the reverse bias direction to read the state of the device. This read-out voltage-pulse sets the device to the basic state. An advantage of this invention is the ease it provides in fabrication of arrays of large numbers of independent non-volatile memory elements upon a single chip of semiconductor material. For use in apparatus for measuring, detecting, or recording information from light, such as an imaging device, it would be desirable to include a means of conducting light to the sensitive region of the device, enabling storage of information therein. Other possible applications for light-sensitive matrices include reading of buffer film storage into a computer, for pattern recognition and as a vidicon device.

Due to the non-volatility of the device, long integration times are possible, which would facilitate detection and measurement of weak sources of light. Imaging devices or simple photodetectors could be electronically shuttered by suitably adjusting the bias level of the constituent elements. Information recorded by light can be read out in the same way as information recorded by other means.

It is expedient to include in the design a temperature control system to maintain the temperature to within a predetermined operating range. For use in a memory device it is desirable to include in the design a mechanism for stabilizing the temperature around a predetermined value. The cryogenic capability of the invention is an advantage in that the mobility of the charge carriers is greatly enhanced at cryogenic temperatures relative to the room temperature mobility. Another advantage of low-temperature operation is the reduction of dissipated power.

The fact that a memory element according to this invention can be as simple as a single diode, rather than a complex multicomponent cell, implies that the number of memory cells per unit chip area can be much higher than that presently attainable. At cryogenic temperatures, lowered resistance of metals allows connecting lines to be made narrower and also decreases areal requirements. Lower temperatures can further increase overall density because less area is required for the removal of heat.

The simplicity of each memory cell, together with the fact that the construction of the invention and arrays thereof uses known semiconductor technology, implies an ease of fabrication which is not present in other memory devices, cryogenic or otherwise.

The fact that the stable states produced in the device by injection or exposure to light form a continuous range of distinguishable stable states implies that it can be used as an analog or multistable device. This in turn means that a single memory element may be used to store more than one bit of information, if used in conjunction with a readout current pulse discriminator. As a consequence, a still further increase in the density of stored information may be obtained.

The aforementioned multistable capability of the device can be utilized in the design of a buffer memory to serve as an intermediary device in the transmission of information between an analog and a digital apparatus.

Since the readout frequency can be varied from 1 cycle per day or less to $10^9$ hertz or more, the effective dynamical range of the device is enormous. This range could be used in connection with photodetectors, polychromator photodetectors, arrays of photodetectors or autoranging versions of these devices.

It is apparent that the present invention has broad fields of application not only as a memory element and as a light-sensitive cell or imaging device, but also as an oscillator or multivibrator element, or for any purpose requiring a non-volatile, multistable component. It is equally apparent that the device could be used as an element of an apparatus for the detection of ionizing radiation of various types in addition to light or electron beams.

This new class of storage devices appears to have significant potential as a new non-volatile semiconductor memory element. The time required for reading and writing (either with an electric pulse or a light pulse) is a nanosecond or less and makes this an attractive possibility for ultra-fast storage devices. As computers become faster in operation, not only is it necessary to have faster and more reliable components but also more compact devices are required to minimize lead length and space. The multistable devices of the present invention, because of their compactness, reliability, low cost and very high speed are practical answers, despite the need, for certain embodiments, to operate at low temperatures.

Those skilled in the art can readily devise other techniques using this invention in applications not discussed above. Consequently, it is to be understood that the examples considered above are merely illustrative and not limiting.

What is claimed is:

1. An information storage device, comprising:
   A. a plurality of individual storage elements, each said storage element having a rectifying region, and a plurality of long-lived states within a predetermined range of temperatures, each said element being switchable from a first long-lived state to a second long-lived state on applying a voltage-sweep across said rectifying region in the reverse bias direction, said voltage-sweep consisting of a voltage which changes from an initial voltage within a known range to at least a predetermined critical reverse bias voltage $V_p$ which is less than the reverse breakdown voltage of said rectifying region and around which reverse bias voltage $V_p$ a current pulse is produced by the storage element during switching, the current pulse being indicative of the state which the switched storage element was in before switching;
   B. means for maintaining said plurality of storage elements at a temperature within said predetermined range of temperatures;
   C. means for producing said voltage-sweep and applying said voltage-sweep across said rectifying region of any selected of said storage elements;
   D. means for detecting said current pulse associated with switching any selected storage element for ascertaining the state which said storage element was in before switching, thereby to read out any information stored in said selected storage element; and
   E. means for writing information into selected of said storage elements by switching said selected storage elements into any selected of said long-lived states.

2. A storage device according to claim 1, further including electrical leads connected to each said rectifying region.

3. A storage device according to claim 1, wherein each said rectifying region comprises a structure which includes two exterior regions and, in between said exterior regions, an interior region comprising semiconductor material.

4. A storage device according to claim 3, wherein each said interior region comprises semiconductor material lightly doped with n-type impurities.

5. A storage device according to claim 3 where each said interior region comprises semiconductor material having localized, weakly bound states of charge carriers.

6. A storage device according to claim 3, wherein each said interior region comprises semiconductor material lightly doped with p-type impurities.

7. A storage device according to claim 3, wherein one of said exterior regions comprises conductive material selected from a group of metals and alloys thereof, and the other exterior region comprises a semiconductor material highly doped with n-type impurities.

8. A storage device according to claim 3, wherein one of said exterior regions comprises conductive material and is selected from a group of metals and alloys thereof, and the other exterior region comprises a semiconductor material highly doped with p-type impurities.

9. A storage device according to claim 3, wherein one of said exterior regions comprises a semiconductor region highly doped with p-type impurities, and the other exterior region comprises a semiconductor region highly doped with n-type impurities.

10. A storage device according to claim 9, wherein said semiconductor material comprises silicon, said p-type impurity comprises boron and said n-type impurity comprises phosphorus.

11. A storage device according to claim 1 wherein said means for writing in information includes means for applying a voltage pulse of predetermined amplitude and duration to each said rectifying region in the forward bias direction so as to switch a selected storage element into a desired long-lived state.

12. A storage device according to claim 1 wherein said means for writing in information includes means for exposing said rectifying region to a predetermined amount of light sufficient to cause said element to switch to a desired long-lived state.

13. A storage device according to claim 1 wherein said means for writing in information includes means for exposing said rectifying region to an electron beam pulse of predetermined levels of energy, intensity and duration, to switch a selected storage element into a desired long-lived state.

14. A storage device according to claim 1 wherein said means for writing in information includes means for creating sufficient numbers of free charge carriers within the rectifying region of any selected of said storage elements, so as to switch the selected storage element into a desired long-lived state.

15. A storage device according to claim 1, wherein each said storage element comprises a pin diode.

16. An information storage device according to claim 1, wherein said plurality of individual storage elements is fabricated on a single chip of semiconductor material.

17. A non-volatile memory device, comprising:
   A. a storage element which includes a rectifying region, having a plurality of long-lived states within a predetermined range of temperatures, said element being switchable from a first long-lived state to a second long-lived state on applying a voltage-sweep across said rectifying region in the reverse bias direction, said voltage-sweep consisting of a voltage which changes from an initial voltage within a known range to at least a predetermined critical reverse bias voltage $V_p$ which is less than the reverse breakdown voltage of said rectifying region and around which reverse bias voltage $V_p$ a current pulse is produced by the storage element during switching, the current pulse being indicative of the state which the switched storage element was in before switching;
   B. means for maintaining said storage element at a temperature within said predetermined range of temperatures;

C. means for producing said voltage-sweep and applying said voltage-sweep across said rectifying region of the storage element;

D. means for detecting said current pulse associated with switching the storage element for ascertaining the state which said storage element was in before switching, thereby to read out any information stored in the storage element; and E. means for writing information into the storage element by switching said storage element into a selected one of said long-lived states.

18. A method of forming, writing into and reading an information storage device using a plurality of individual storage elements, each of which has a rectifying region and a plurality of long-lived states within a predetermined range of temperatures, wherein each said storage element is switchable from at least a first long-lived state to a second long-lived state on applying a voltage-sweep across said rectifying region in the reverse bias direction, said voltage-sweep consisting of a voltage which changes from an initial voltage within a known range to at least a predetermined critical reverse bias voltage $V_p$ which is less than the reverse breakdown voltage of said rectifying region and around which reverse bias voltage $V_p$ a current pulse is produced by the storage element during switching, said current pulse being indicative of the state which the switched storage element was in before switching, said method comprising the steps of:

A. maintaining said plurality of individual storage elements at a temperature within said predetermined range of temperatures;

B. writing in information as desired, into selected of said storage elements by switching each of said selected storage elements into a desired state of said long-lived states;

C. switching a storage element for purposes of reading stored information, said step of switching consisting of applying said voltage-sweep across said rectifying region of each of said selected storage elements to produce a current pulse output from each switched storage element;

D. detecting said current-pulse output of each said switched storage element for ascertaining a prior state of the switched storage element, thereby to read stored information.

19. A method as in claim 18 which includes the step of forming the rectifying region of each storage element of said plurality of elements to comprise a structure which includes two exterior regions, and in between said exterior regions, an interior region comprising semiconductor material.

20. A method as in claim 19 wherein said interior region of said rectifying region of each element of said plurality of elements comprises semiconductor material lightly doped with n-type impurities.

21. A method as in claim 19 wherein said interior region of said rectifying region of each element of said plurality of elements comprises semiconductor material having localized, weakly bound states of charge carriers.

22. A method as in claim 19 wherein said interior region of said rectifying region of each element of said plurality of elements comprises semiconductor material lightly doped with p-type impurities.

23. A method as in claim 19 wherein one of said exterior regions of said rectifying region of each element of said plurality of elements comprises a conductive material selected from a group consisting of metals and alloys thereof, and the other exterior region of said rectifying region of each element of said plurality of elements comprises a semiconductor region highly doped with n-type impurities.

24. A method as in claim 19 wherein one of said exterior regions of said rectifying region of each element of said plurality of elements comprises a conductive material selected from a group consisting of metals and alloys thereof, and the other exterior region of said rectifying region of each element of said plurality of elements comprises a semiconductor region highly doped with p-type impurities.

25. A method as in claim 19 wherein one of said exterior regions of said rectifying region of each element of said plurality of elements comprises a semiconductor region highly doped with p-type impurities, and the other exterior region of said rectifying region of each element of said plurality of elements comprises a semiconductor region highly doped with n-type impurities.

26. A method as in claim 18 wherein said step of writing in information comprises applying a voltage pulse of predetermined amplitude and duration to said rectifying region of each said selected memory element in the forward bias direction so as to cause said selected memory element to switch to the desired long-lived state.

27. A method as in claim 18 wherein said method of writing in information comprises exposing said rectifying region of each said selected memory element to a predetermined amount of light sufficient to cause said selected element to switch to the desired long-lived state.

28. A method as in claim 18 wherein said step of writing in information comprises exposing said rectifying region of each said selected memory element to an electron beam pulse of predetermined levels of energy, intensity and duration so as to cause said selected memory element to switch to the desired long-lived state.

29. A method as in claim 18 wherein said step of writing in information comprises creating sufficient numbers of free charge carriers within said rectifying region of each said selected element so as to cause said selected element to switch to the desired long-lived state.

30. A method as in claim 18 wherein said step of writing information into each of said selected elements by switching each said selected element into one of its multiplicity of long-lived states comprises exposing said rectifying region to an external source of photons so as to cause said element to switch to one of its multiplicity of long-lived states and wherein said step of reading stored information includes determining the integrated photon flux by ascertaining said long-lived state to which each said element was switched after exposure of each said rectifying region to said external source of photons.

31. A method as in claim 18, wherein said step of writing in information comprises exposing each said element to an external source of photons so as to cause each said element to switch to one of its multiplicity of long-lived states and wherein said step of reading stored information comprises determining the integrated photon flux on each said element by ascertaining said long-lived state to which said element was switched after exposure of said element to said external source of photons.

* * * * *